US008406357B2

(12) United States Patent
Yamazaki et al.

(10) Patent No.: US 8,406,357 B2
(45) Date of Patent: Mar. 26, 2013

(54) FILTER CIRCUIT

(75) Inventors: Daisuke Yamazaki, Kawasaki (JP);
Kazuhiko Kobayashi, Kawasaki (JP);
Kazuaki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 809 days.

(21) Appl. No.: 12/034,619

(22) Filed: Feb. 20, 2008

(65) Prior Publication Data
US 2008/0211597 A1    Sep. 4, 2008

(30) Foreign Application Priority Data

Feb. 21, 2007    (JP) ................. 2007-041304

(51) Int. Cl.
*H04B 1/10*    (2006.01)
(52) U.S. Cl. .......... 375/350; 375/344; 375/345; 455/73; 455/78; 455/83; 455/113; 455/296; 455/313; 455/326
(58) Field of Classification Search .......... 375/344–345, 375/350; 455/73, 77, 78, 10, 112–119, 205, 455/207, 210, 213, 257, 258, 283–285, 306, 455/307, 313–326
See application file for complete search history.

(56) References Cited

U.S. PATENT DOCUMENTS

| 4,914,408 | A | 4/1990 | Voorman |
| 7,729,317 | B2 | 6/2010 | Payne et al. |
| 2004/0087279 | A1* | 5/2004 | Muschallik et al. ............ 455/73 |
| 2005/0048928 | A1* | 3/2005 | Jeon et al. ........................ 455/78 |
| 2006/0056357 | A1 | 3/2006 | Payne et al. |

FOREIGN PATENT DOCUMENTS

| JP | 2004-515104 A | 5/2004 |
| JP | 2006-507751 | 3/2006 |
| WO | 02-43259 A2 | 5/2002 |

OTHER PUBLICATIONS

Japanese Intellectual Property Office "Reasons for Rejection" issued for corresponding Japanese Patent Application No. 2007-041304, mailed Mar. 1, 2011. Partial English translation attached.

\* cited by examiner

*Primary Examiner* — Daniel Washburn
*Assistant Examiner* — Eboni Hughes
(74) *Attorney, Agent, or Firm* — Myers Wolin, LLC

(57) ABSTRACT

A filter circuit including first and second real filters of a zero-IF scheme. The first and second real filters receive an I component and a Q component separated from a reception signal, respectively; and a switch section for producing a complex filter by switchably connecting the first and second real filters through interconnection elements. The switch section further receiving a switching signal for connecting the first and second real filters, thereby switching from the zero-IF scheme to a low-IF scheme.

17 Claims, 12 Drawing Sheets

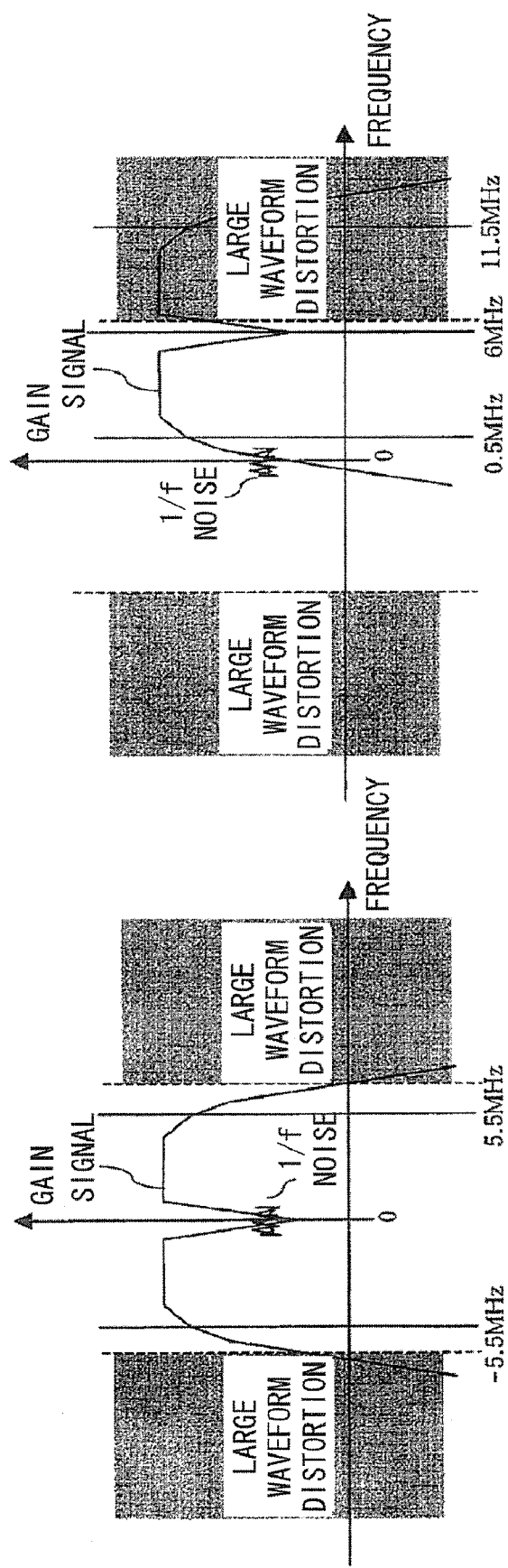

FILTER CIRCUIT

1. FIELD OF THE INVENTION

The present invention relates to a filter circuit. More particularly, the invention relates to a filter circuit which is used for processing an image in a high-frequency transmission/reception circuit of a wireless communications apparatus which employs a communication scheme such as QPSK, QAM, OFDM, or OFDMA.

2. DESCRIPTION OF THE RELATED ART

FIG. 1 shows an exemplary configuration of a general RF module as a high-frequency transmission/reception circuit of a wireless communications apparatus as mentioned above. The reception system of the RF module 100 amplifies a high-frequency reception signal $RF_{in}$ (of 2.5 GHz, for example) with an operational amplifier 1 and sends an amplified signal to a mixer 2. A pair of output signals of the operational amplifier 1, that is, a non-inverted (positive-side) signal and an inverted (negative-side) signal which is different in phase from the non-inverted signal by 180° are input to the mixer 2. Every signal described below includes both of a non-inverted signal and an inverted signal although not described in such a manner.

The mixer 2 is also supplied with a local oscillation signal which is generated on the basis of a reference frequency signal $f_{ref}$ by a voltage-controlled oscillator VCO which is provided in a PLL circuit 40. The mixer 2 outputs an IF (intermediate frequency) signal having a frequency that is the difference between the frequencies of the two signals. The IF signal has a relatively high frequency of hundreds of megahertz. A lowpass filter 3 extracts a low-frequency component from the IF signal which is output from the mixer 2, and sends it to mixers 4 and 5. Each of the mixers 4 and 5 is supplied with a signal from a frequency divider 6. The frequency divider 6 receives the same local oscillation signal as supplied from the PLL circuit 40 to the mixer 2, and sends a phase-rotated (90°-rotated) signal and a phase-unrotated (0°-rotated) signal to the mixers 4 and 5, respectively.

Each of the mixers 4 and 5 converts the IF signal having a relatively high frequency which is output from the mixer 2 into an IF signal having a lower frequency (or a baseband signal) and outputs the latter. At this time, the mixers 4 and 5 output a Q-component (quadrature phase component) signal and an I-component (in-phase component) signal, respectively, which are separated from each other. The output signals of the mixers 4 and 5 are sent to respective lowpass filters 7 and 8 (which constitute a filter circuit 9). Low-frequency components (baseband signals) are extracted from the Q-component signal and the I-component signal by the respective filter circuits 7 and 8 and output via respective operational amplifiers 10 and 11.

As such, the RF module 100 outputs a non-inverted signal $R_{X-Iout}$ and an inverted signal $R_{X-Ioutx}$ (suffix "x" is added) of the I-component baseband signal and a non-inverted signal $R_{X-Qout}$ and an inverted signal $R_{X-Qoutx}$ of the Q-component baseband signal.

In the transmission system of the RF module 100, signals are processed in a manner that is substantially opposite to the above-described manner of processing in the reception system.

That is, an operational amplifier 21 amplifies a Q-component baseband signal $T_{X-Qin}$ and its inverted signal $T_{X-Qinx}$ and outputs resulting signals to a lowpass filter 23. An operational amplifier 22 amplifies an I-component baseband signal $T_{X-Iin}$ and its inverted signal $T_{X-Iinx}$ and outputs resulting signals to a lowpass filter 24. The lowpass filters 23 and 24 extract prescribed low-frequency components from the output signals of the operational amplifiers 21 and 22 and sends them to mixers 25 and 26, respectively.

The mixers 25 and 26 are connected so as to receive output signals of a frequency divider 27 which corresponds to the above-described frequency divider 6. Like the frequency divider 6, the frequency divider 27 generates a phase-rotated (90°-rotated) signal and a phase-unrotated signal, respectively, using the local oscillation signal which is supplied from the PLL circuit 40, and supplies them to the mixers 25 and 26, respectively.

The mixers 25 and 26 generate a Q-component IF signal and an I-component IF signal by frequency conversion and send them to a combiner 28. The combiner 28 combines the IF signals supplied from the mixers 25 and 26, and sends a resulting signal to a mixer 29. Using the local oscillation signal supplied from the PLL circuit 40, the mixer 29 converts the received signal into a high-frequency signal, which is amplified by an operational amplifier 30. A resulting signal is output as a high-frequency signal $RF_{out}$ (of 2.5 GHz).

FIG. 2 shows a conventional configuration example of each of the lowpass filters 7 and 8 which constitute the filter circuit 9 of the RF module 100 of FIG. 1. FIG. 2 (Real Filter ($Q_{ch}$) (1)) shows only the lowpass filter 7 (Qch) for the Q component. The lowpass filter 8 (Ich) for the I component is substantially the same in configuration as the lowpass filter 7 (Qch).

In this example shown in FIG. 2, the lowpass filter 7 is composed of first-order lowpass filters 7a-7e which are in a 5-stage cascade connection and is a real filter having a bandwidth of 1 MHz. The lowpass filters 7a-7e have respective operational amplifiers OP1-OP5. In each of the lowpass filters 7a-7e, input resistors are connected to the inverting input terminal and the non-inverting input terminal of the operational amplifier, respectively. A parallel circuit of a resistor and a capacitor is connected between the inverting input terminal and the non-inverting output terminal of the operational amplifier, and another parallel circuit of a resistor and a capacitor is connected between the non-inverting input terminal and the inverting output terminal of the operational amplifier.

For example, the lowpass filter 7a is composed of an input resistor R1 for receiving an input signal $Q_{in}$, an input resistor R2 for receiving an inverted input signal $Q_{inx}$, a parallel connection of a resistor R3 and a capacitor C1 which is connected between the non-inverting input terminal and the inverting output terminal of the operational amplifier OP1, and a parallel connection of a resistor R4 and a capacitor C2 which is connected between the inverting input terminal and the non-inverting output terminal of the operational amplifier OP1. In each of the other lowpass filters 7b-7e, resistors and capacitors are connected to the operational amplifier OP2, OP3, OP4, or OP5 in the same manner as in the lowpass filter 7a (see FIG. 2(1)).

FIG. 2(2) shows an operation characteristic which is common to the lowpass filters 7a-7e. As shown in FIG. 2(2), each of the lowpass filters 7a-7e has a characteristic of 3-dB attenuation in the first-order band. In the configuration of FIG. 2(1), no peaking operation is performed.

The lowpass filters 7a-7e each of which has the attenuation characteristic of FIG. 2(2) and which are in a 5-stage cascade connection as shown in FIG. 2(1) exhibit a characteristic of a total of 15-dB attenuation (3 dB×5) (see FIG. 2(3)).

Aside from the conventional example of FIG. 2, a fifth-order Butterworth lowpass filter as shown in FIG. 3 may be used as a real filter which serves as each of the lowpass filters 7 and 8 which constitute the filter circuit 9 shown in FIG. 1.

As shown in FIG. 3 (Real Filter ($Q_{ch}$)), (1), this real filter has operational amplifiers OP1-OP5 which are in a 5-stage cascade connection. Whereas, a first-stage lowpass filter 7_1 has the same configuration as the lowpass filter 7a of the real filter 7 shown in FIG. 2(1), the operational amplifiers OP2 and OP3 constitute, together with resistors and capacitors that are connected as shown in FIG. 3(1), a second-order lowpass filter 7_2 having a peaking function. Likewise, the operational amplifiers OP4 and OP5 constitute, together with resistors and capacitors that are connected as shown in FIG. 3(1), a second-order lowpass filter 7_3 having a peaking function. The capacitors used in the lowpass filters 7_2 and 7_3 are variable capacitors.

A fifth-order Butterworth lowpass filter is constructed in the above manner (one first-order filter plus two second-order filters). As shown in FIG. 3(2), the lowpass filter 7_1 exhibits attenuation of 3 dB as in the attenuation characteristic of FIG. 2(2). As shown in FIG. 3(2), the second-order lowpass filter 7_2 exhibits 6-dB attenuation in the second-order band. However, because of 2-dB peaking, the lowpass filter 7_2 exhibits an attenuation characteristic of 4 dB resultingly. As shown in FIG. 3(2), the second-order lowpass filter 7_3 exhibits 6-dB attenuation in the second-order band. However, because of 10-dB peaking, the lowpass filter 7_3 exhibits an amplification characteristic of 4 dB resultingly.

As shown in FIG. 3(3), a resulting attenuation of lowpass filters 7_1 to 7_3 provides an attenuation factor of 15 dB. However, because of the 12-dB peaking by the second-order lowpass filters 7_2 and 7_3, the total attenuation of the lowpass filters 7_1 to 7_3 in the band is reduced to 3 dB.

FIGS. 4A & 4B show a comparison of the attenuation characteristic of the real filter of FIG. 2(1) having the first-order lowpass filters which are in a 5-stage cascade connection and the real filter of FIG. 3(1) which is the fifth-order Butterworth lowpass filter.

The attenuation characteristic shown in FIG. 4A is the same as that shown in FIG. 2(3). Since this is the attenuation characteristic of the real filter which is the 5-stage cascade connection of the first-order lowpass filters, a high-frequency portion of a signal is attenuated by 15 dB. It is seen that the attenuation characteristic of the real filter shown in FIG. 4B of the fifth-order Butterworth lowpass filter causes attenuation of only 3 dB.

Therefore, it is preferable that, as shown in FIG. 5, the fifth-order Butterworth lowpass filter of FIG. 3(1) be used as each of the lowpass filters 7 and 8 of the filter circuit 9 of the RF module 100 shown in FIG. 1. Fifth-order Butterworth lowpass filters are not the sole Butterworth lowpass filters available; third-order, seventh-order, and ninth-order Butterworth lowpass filters are also available.

FIG. 6A shows a frequency characteristic that is obtained when the filter circuit 9 is composed of the real filters 7 and 8 that are shown in FIG. 5. In this frequency characteristic which is called a zero-IF frequency characteristic, there is no discrimination between the positive frequency and the negative frequency and a signal can pass the filter circuit 9 in a −f-3 dB to f-3 dB frequency band.

This kind of zero-IF filter is effective when used in schemes with spectrum spreading such as OFDM (orthogonal frequency division multiplexing) and UMTS (universal mobile telecommunications system).

On the other hand, it is known that low-IF filters are effective when used in GSM (global system for mobile communication) or DECT (digital enhanced cordless telecommunications). FIG. 6B shows a low-IF frequency characteristic.

In the low-IF frequency characteristic of FIG. 6B, a signal having an f-3 dB frequency can pass the filter but a signal having a −f-3 dB frequency is rejected. That is, this frequency characteristic provides an advantage that where a signal substantially has only positive-frequency components (there are no negative-frequency components), noise in a negative frequency band, if any, can be rejected.

The filter circuit 9 which is composed of the real filters 7 and 8 of FIG. 5 cannot realize the frequency characteristic of FIG. 6B. It is necessary to use a complex filter as shown in FIG. 7.

The complex filter of FIG. 7 is configured in such a manner that the real filters 7 and 8 of the filter circuit 9 shown in FIG. 5 are connected to each other by resistors. More specifically, as for the operational amplifiers of the same stage of the real filters 7 and 8, the input terminals of the operational amplifier of the real filter 7 have the same polarities as the corresponding output terminals of the operational amplifier of the real filter 8. That is, the non-inverting input terminal of the operational amplifier of the real filter 7 is connected to the non-inverting output terminal of the operational amplifier of the real filter 8, and the inverting input terminal of the operational amplifier of the real filter 7 is connected to the inverting output terminal of the operational amplifier of the real filter 8. The output terminals of the operational amplifier of the real filter 7 are opposite in polarity to the corresponding input terminals of the operational amplifier of the real filter 8. That is, the non-inverting output terminal of the operational amplifier of the real filter 7 is connected to the inverting input terminal of the operational amplifier of the real filter 8, and the inverting output terminal of the operational amplifier of the real filter 7 is connected to the non-inverting input terminal of the operational amplifier of the real filter 8.

For example, the inverting input terminal of the operational amplifier OP1 of the first-order lowpass filter 7_1 of the real filter 7 is connected to the inverting output terminal of the operational amplifier OP1 of the first-order lowpass filter 8_1 of the real filter 8 via a resistor R22. The non-inverting input terminal of the operational amplifier OP1 of the first-order lowpass filter 7_1 is connected to the non-inverting output terminal of the operational amplifier OP1 of the first-order lowpass filter 8_1 via a resistor R21. The non-inverting output terminal of the operational amplifier OP1 of the first-order lowpass filter 7_1 is connected to the inverting input terminal of the operational amplifier OP1 of the first-order lowpass filter 8_1 via a resistor R24. The inverting output terminal of the operational amplifier OP1 of the first-order lowpass filter 7_1 is connected to the non-inverting input terminal of the operational amplifier OP1 of the first-order lowpass filter 8_1 via a resistor R23.

Likewise, the pair of operational amplifiers OP2, OP3, OP4, or OP5 of the real filters 7 and 8 are connected to each other by resistors R31-R34, R41-R44, R51-R54, or R61-R64.

FIGS. 8A & 8B show why the complex filter of FIG. 7 exhibits the low-IF characteristic of FIG. 6B.

In FIGS. 8A & 8B, the term "positive frequency" means that as shown in FIG. 8A(a) the phase of the Q component is delayed from that of the I component by 90°. The term "negative frequency" means that as shown in FIG. 8B(a) the phase of the Q component leads that of the I component by 90°. In the case of the positive frequency, as shown in FIG. 8A(a), the phases of the signals $I_{in}$, $Q_{in}$, $I_{inx}$, and $Q_{inx}$ are deviated from each other by 90°.

Connections are made so that the phases of an input and a corresponding output are deviated from each other by 90° at a signal frequency because of the delaying operation of a lowpass filter. For example, since the period of a signal having a bandwidth of 1 MHz is 1 μs, a phase deviation of 90° is obtained if a delay of 0.25 μs (¼ of 1 μs) occurs in a lowpass filter.

Therefore, in a complex filter, it is possible to pass signals in a positive frequency band and attenuate signals in a negative frequency band by connecting the terminals $I_{in}$ and $Q_{out1x}$, $Q_{in}$ and $I_{out1}$, $I_{inx}$ and $Q_{out1}$, and $Q_{inx}$ and $I_{out1x}$ via resistors as shown in FIG. 7. As a result, signals having a positive frequency pass satisfactorily because they are given the same polarity and hence strengthen each other as shown in FIG. 8A (b). Signals having a negative frequency attenuate because they are given opposite polarities and hence weaken each other as shown in FIG. 8B(b). The low-IF characteristic shown in FIG. 6B is thus obtained.

Where the filter circuit 9 shown in FIG. 1 is constructed by the real filters 7 and 8 as shown in FIG. 5 which have a zero-IF characteristic, it is effective to use the filter circuit 9 in such a communication scheme as OFDM or UMTS. This is desirable in the IEEE 802.11b signal spectra.

This is explained in FIGS. 9A & 9B. Lowpass filters have problems that the SN ratio (signal-to-noise ratio) of a signal is deteriorated by 1/f noise around 0 MHz and that waveform distortion is increased at high frequencies by a circuit gain and bandwidth deterioration. Therefore, an IEEE 802.11b signal has the following relationships with the zero-IF scheme and the low-IF scheme.

(1) Since no signal components exist in a central portion of the spectrum, in the zero-IF scheme, no problem arises even if 1/f noise occurs (see FIG. 9A).

(2) Because a central frequency of the signal spectrum shifts from 0 Hz to 6 MHz, in the low-IF scheme, signal components exist in such a region as to be adversely affected by waveform distortion (see FIG. 9B).

Therefore, it is understood that the zero-IF real filter of FIG. 5 is suitable for a signal used in the IEEE 802.11b scheme.

As shown in FIGS. 10A & 10B, for the following reasons, a low-IF complex filter (refer to U.S. Pat. No. 4,914,408) is suitable for a Bluetooth scheme.

(1) Since a signal exists in a central portion of the spectrum, in the zero-IF scheme, if there is a 1/f noise in the central portion of the spectrum, the 1/f noise has an adverse affect on the signal (see FIG. 10A).

(2) Because a central frequency of signal spectrum shifts from 0 Hz to 2 MHz, even in the low-IF scheme, a design can be made so that a signal occupies only a region that is free of waveform distortion (see FIG. 10A).

Therefore, radio receiving apparatus capable of receiving both of IEEE 802.11b signals and Bluetooth signals require both of a zero-IF filter and a low-IF filter.

JP-T-2004-515104 (The symbol "JP-T" as used herein means a published Japanese translation of a PCT application) discloses a technique for common use by the zero-IF scheme and the low-IF scheme. In this technique, a real filter is used for the zero IF scheme. In the case of the low-IF scheme, one of the outputs of the real filter is used and a backstage digital complex filter is also used.

In the technique of JP-T-2004-515104 for common use by the zero-IF scheme and the low-IF scheme, only part of the real filter is used for both of the zero-IF scheme and the low-IF scheme, which results in a problem that the backstage digital complex filter increases the chip area and the power consumption. Accordingly, there is a need to overcome the deficiencies of the prior art.

3. SUMMARY

In view of the above noted deficiencies it would be advantageous to decrease the chip area and the power consumption by simplifying the circuit configuration in a filter circuit which is used for both of the zero-IF scheme and the low-IF scheme.

To attain the above object, a filter circuit according to the device comprises first and second real filters of a zero-IF scheme which are provided for an I component and a Q component to be separated from a reception signal, respectively; and a switch section for producing a complex filter by connecting the first and second real filters with interconnection elements when receiving a switching signal for switching from the zero-IF scheme to a low-IF scheme.

4. BRIEF DESCRIPTION OF THE DRAWINGS

FIGS. 9A & 9B illustrate relationships between an IEEE 802.11b signal and the zero-IF and low-IF schemes;

5. DETAILED DESCRIPTION OF THE EMBODIMENTS

Figure 1:
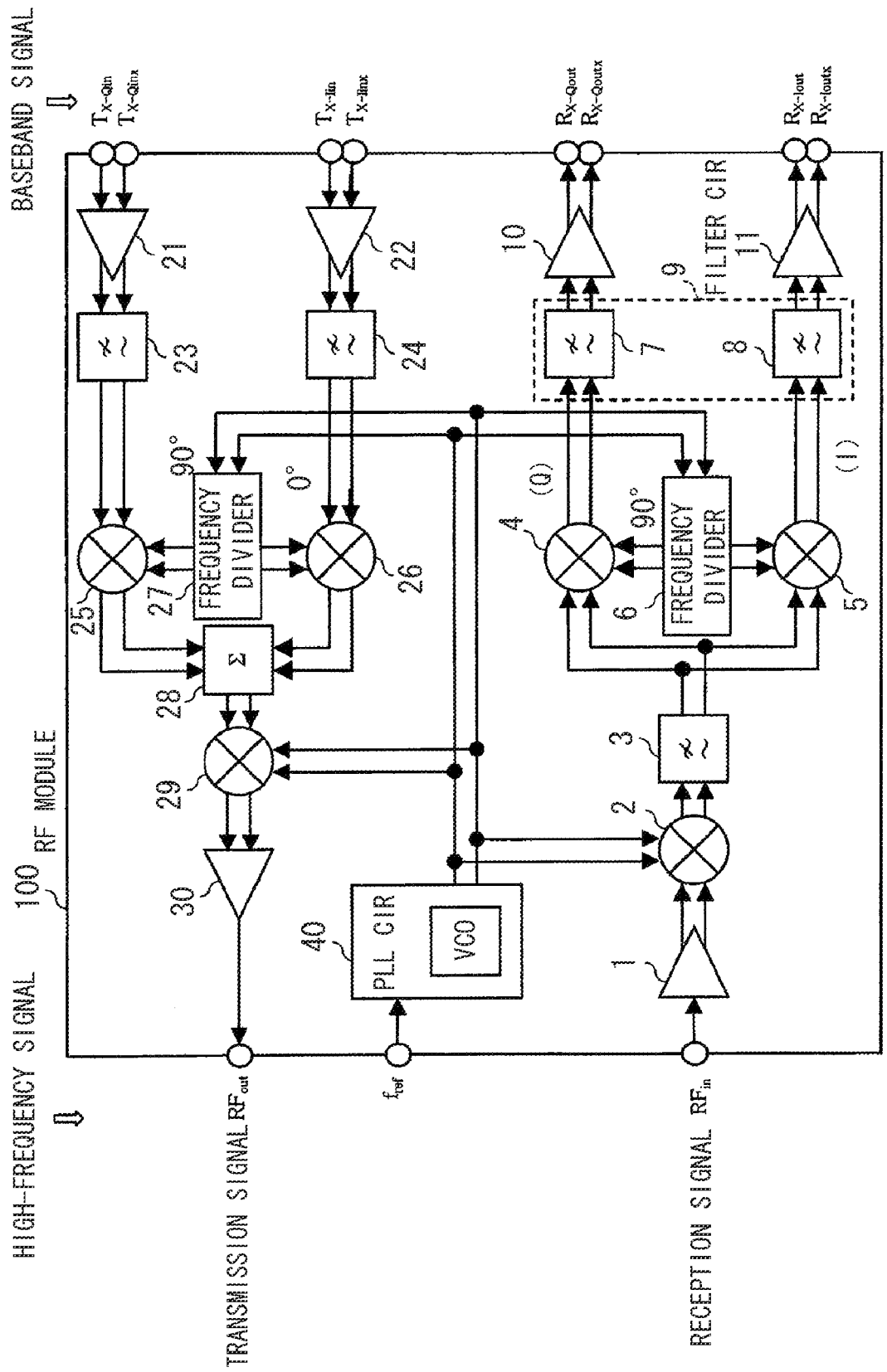
FIG. 1 shows a circuit configuration of a general RF module, having a filter circuit, of a wireless communications apparatus.
Figure 2:
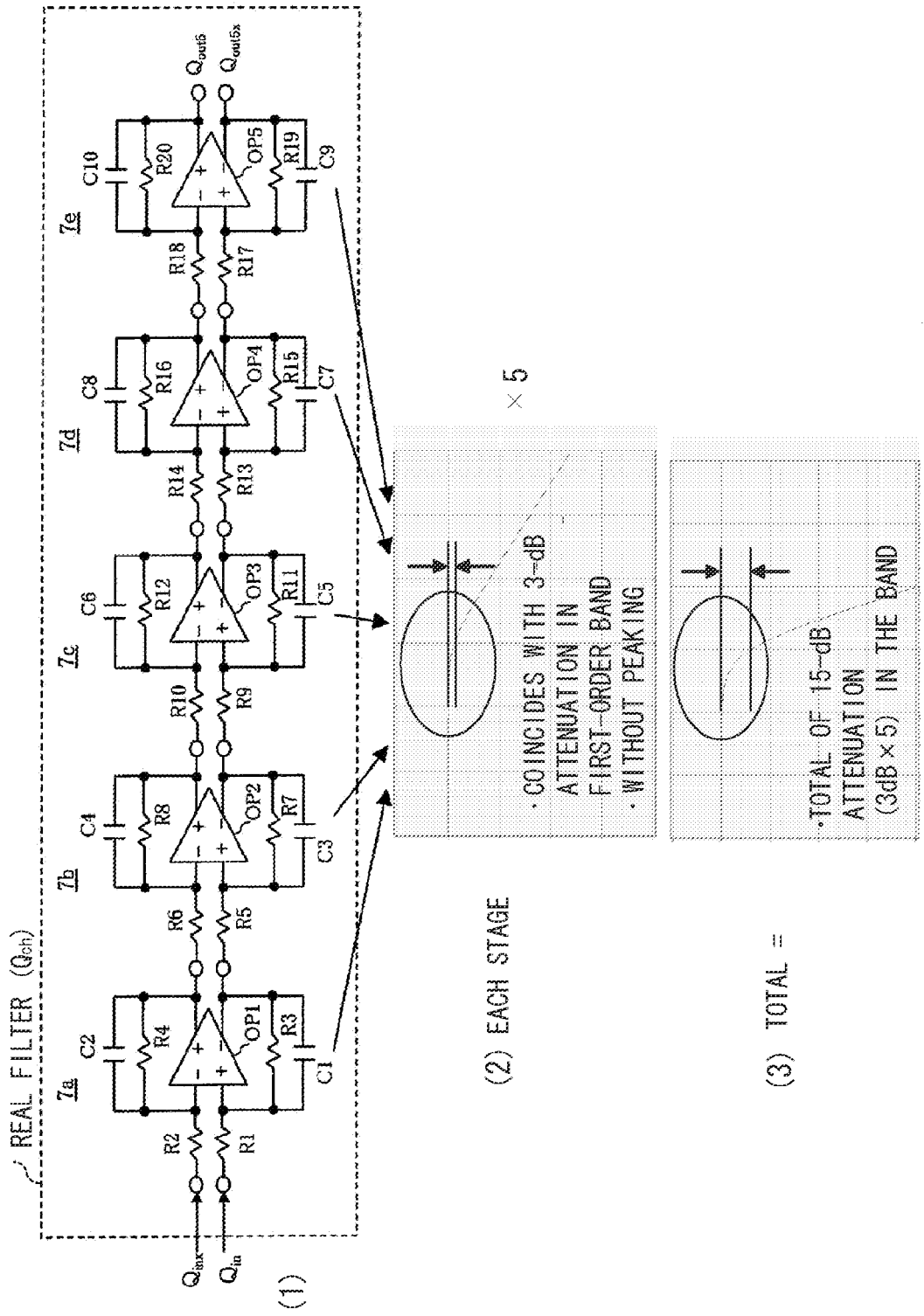
FIG. 2 shows an exemplary real filter which is part of a filter circuit shown in FIG. 1 and has first-order lowpass filters that are in a 5-stage cascade connection.
Figure 3:
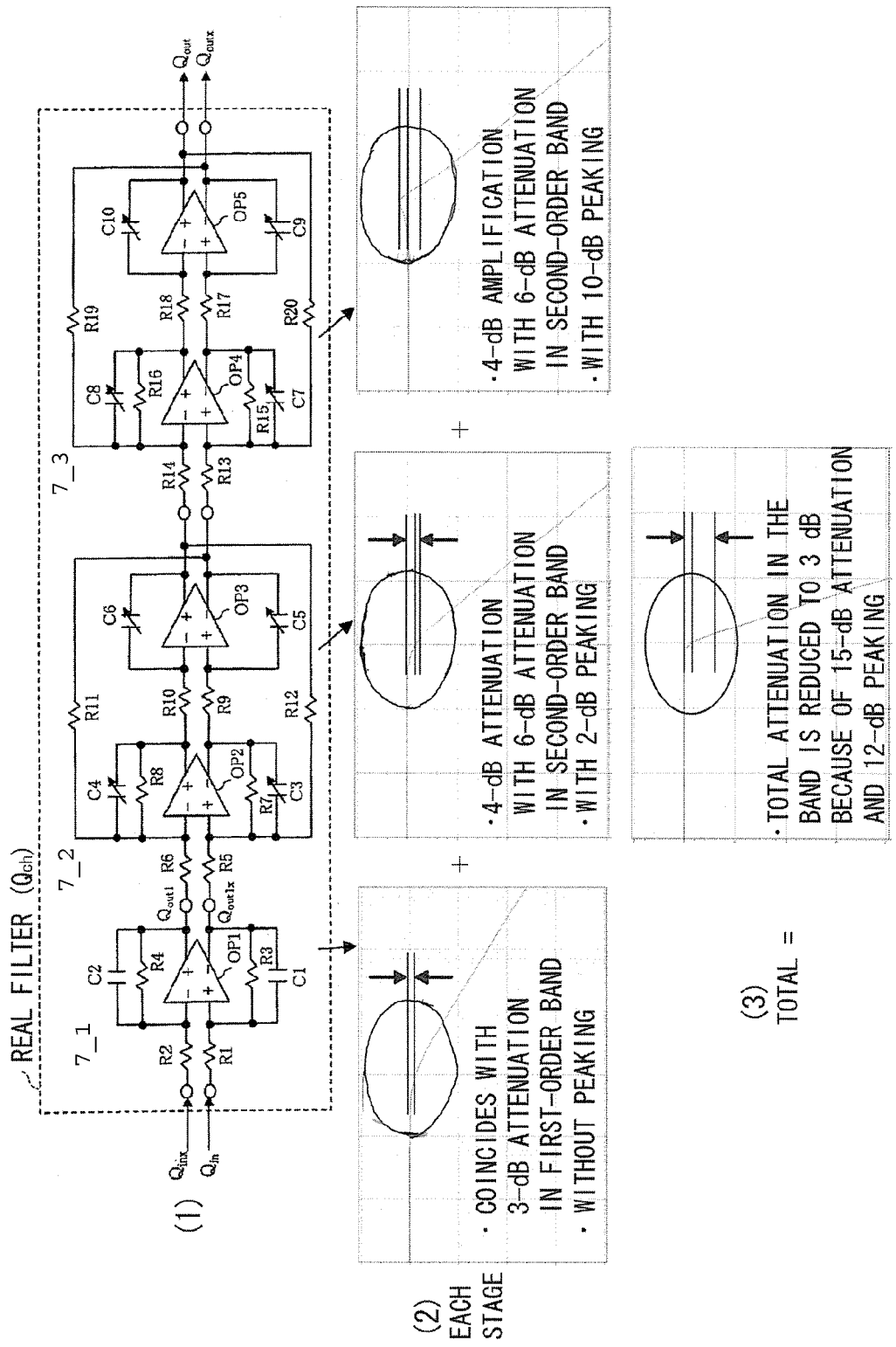
FIG. 3 shows an exemplary real filter which is part of the filter circuit shown in FIG. 1 and is a fifth-order Butterworth lowpass filter.
Figure 4A:
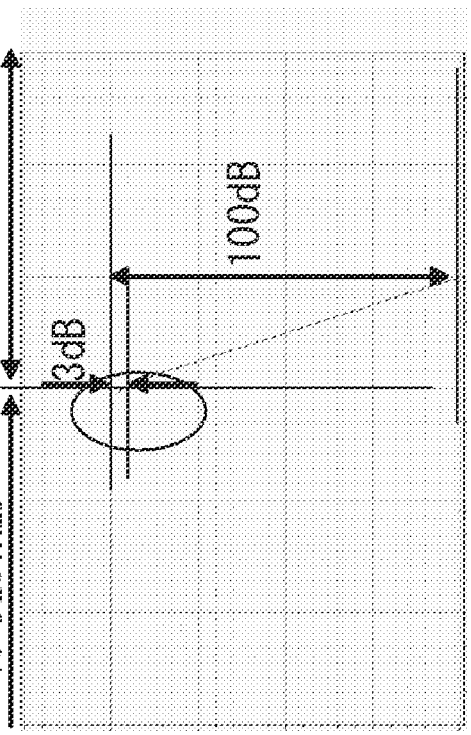
FIGS. 4A & 4B show graphs comparing attenuation characteristics of the real filters of FIGS. 2 and 3.
Figure 4B:
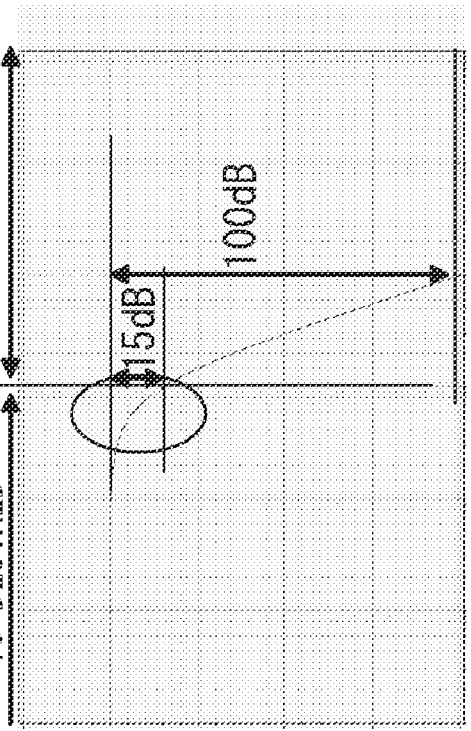

This disclosure describes the best mode or modes of practicing the invention as presently contemplated. It is important to note that these embodiments are only examples to advise one of ordinary skill in the art of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the various views of the drawings, like reference characters designate like or similar parts.

Figure 11:
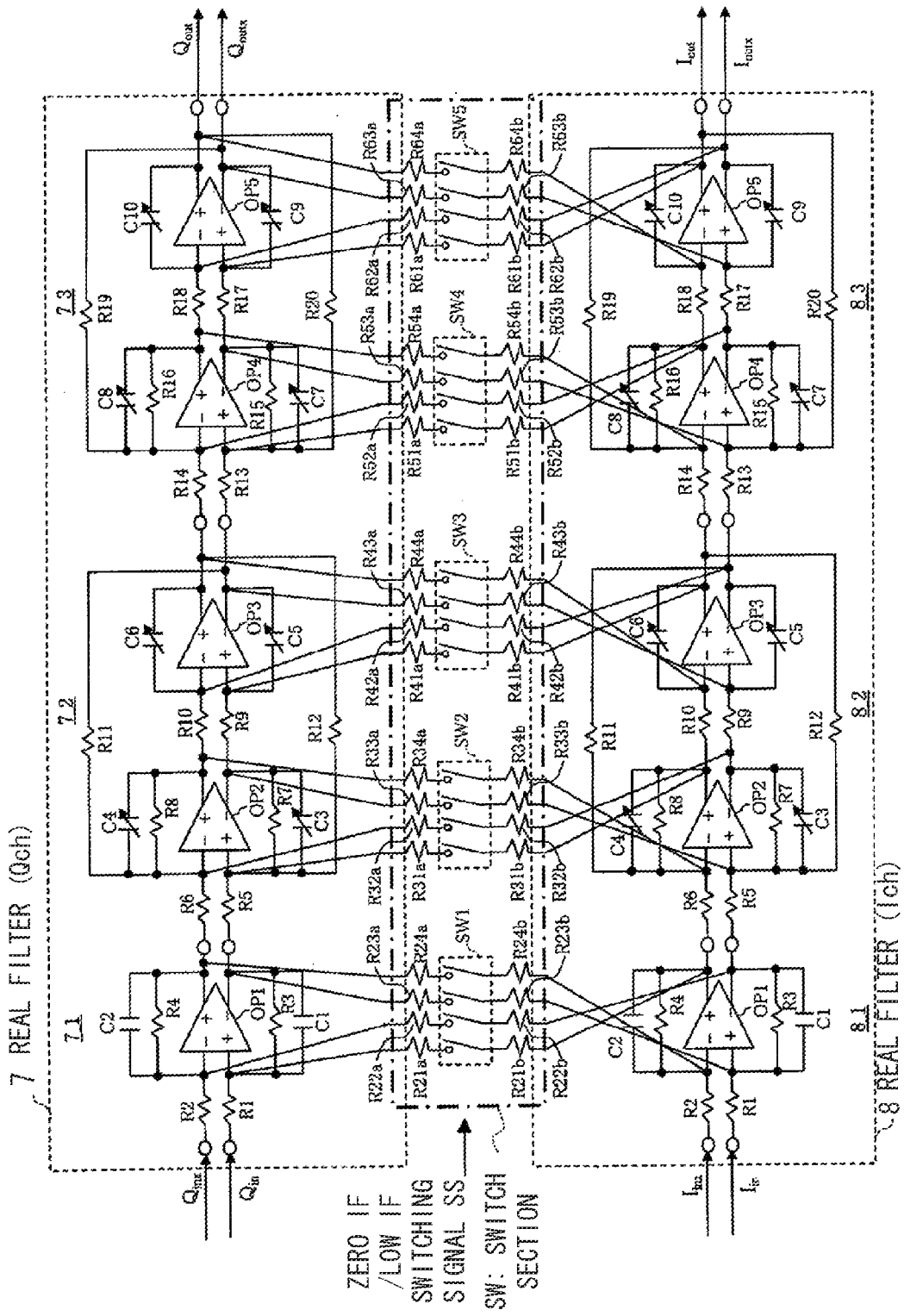
FIG. 11 is a circuit diagram of a filter circuit according to an exemplary embodiment of the present invention.

FIG. 11 shows a filter circuit according to an exemplary embodiment of the present invention. This embodiment is different from the conventional example of FIG. 7 in that the present embodiment is equipped with a switch section SW which is composed of resistors that connect the real filters 7 and 8 and switches for rendering the resistors operative or inoperative.

In the switch section SW, resistors R21, R22, R23, and R24 which connect the operational amplifiers OP1 of the first-order lowpass filters 7_1 and 8_1 are divided into resistors R21a and R21b, R22a and R22b, R23a and R23b, and R24a and R24b, respectively, and are rendered operative or inoperative by a switch SW1. Likewise, in the switch section SW, resistors R31, R32, R33, and R34 which connect the operational amplifiers OP2 of the second-order lowpass filters 7_2 and 8_2 are divided into resistors R31a and R31b, R32a and R32b, R33a and R33b, and R34a and R34b, respectively, and are rendered operative or inoperative by a switch SW2. Resistors R41, R42, R43, and R44 which connect the operational amplifiers OP3 of the second-order lowpass filters 7_2 and 8_2 are divided into resistors R41a and R41b, R42a and R42b, R43a and R43b, and R44a and R44b, respectively, and are rendered operative or inoperative by a switch SW3.

Furthermore, in the switch section SW, resistors R51, R52, R53, and R54 which connect the operational amplifiers OP4 of the second-order lowpass filters 7_3 and 8_3 are divided into resistors R51a and R51b, R52a and R52b, R53a and R53b, and R54a and R54b, respectively, and are rendered operative or inoperative by a switch SW4. Resistors R61, R62, R63, and R64 which connect the operational amplifiers OP5 of the second-order lowpass filters 7_3 and 8_3 are divided into resistors R61a and R61b, R62a and R62b, R63a and R63b, and R64a and R64b, respectively, and are rendered operative or inoperative by a switch SW5. Although the resistors R21-R64 are divided by the switches SW1-SW5, it goes without saying that the resistors R21-R64 may be connected to one terminal of the switches SW1-SW5 instead of being divided.

Figure 5:
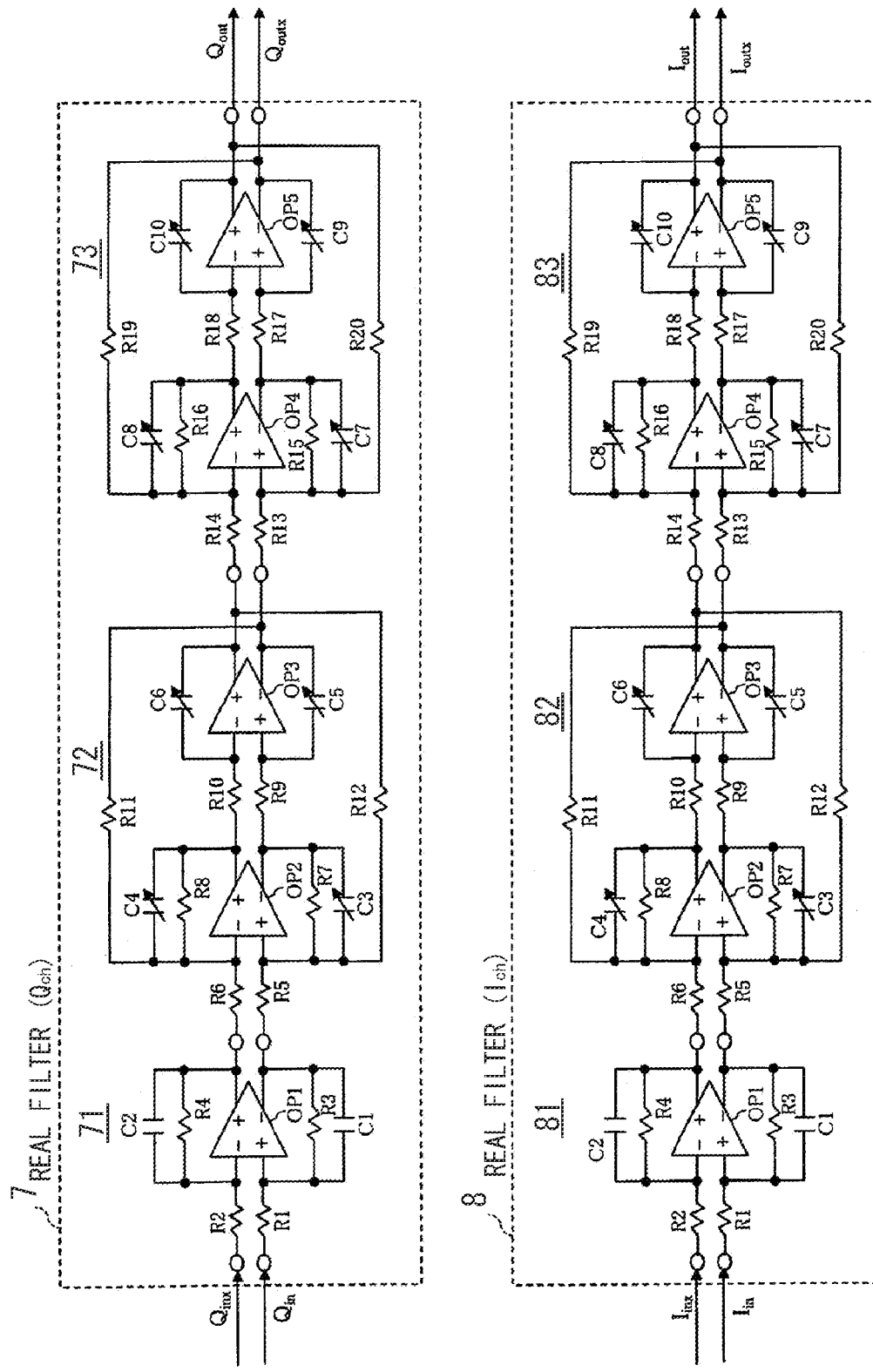
FIG. 5 shows a configuration of the filter circuit shown in FIG. 1 which employs the fifth-order Butterworth lowpass filters.
Figure 6B:
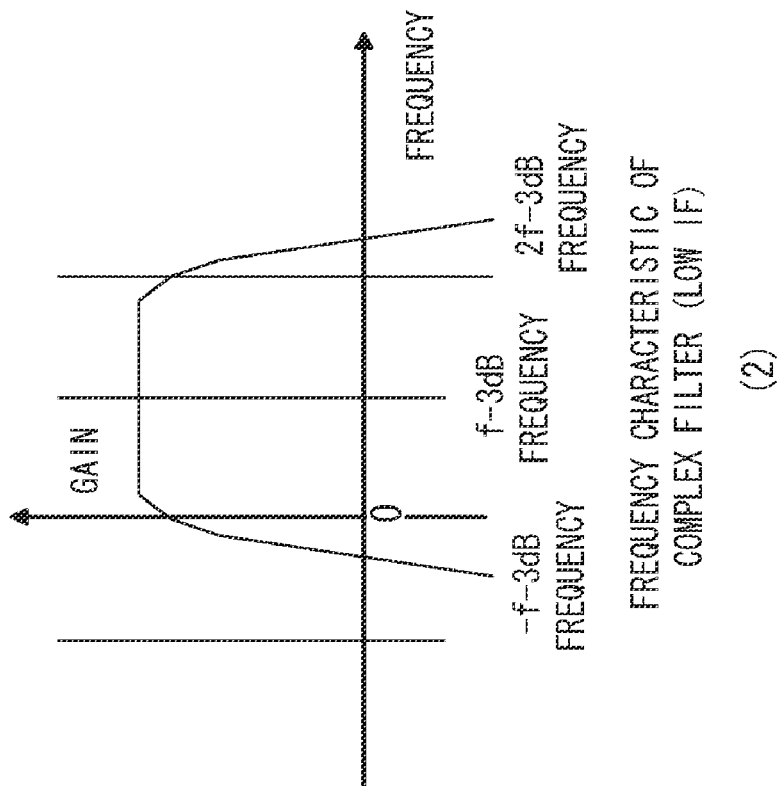
FIGS. 6A & 6B show zero-IF and low-IF frequency characteristics.
Figure 6A:
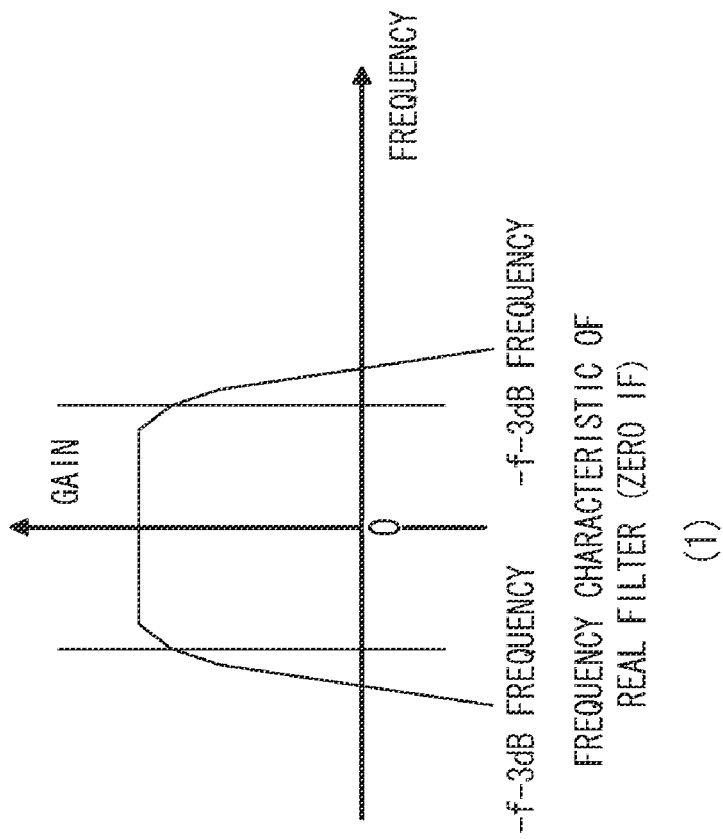

In the above configuration, a zero IF/low IF switching signal SS is supplied to the switches SW1-SW5. If the switching signal SS is off and hence indicates the zero-IF scheme, all of the switches SW1-SW5 are controlled to an off state, whereby the filter circuit of FIG. 5 which is a real filter is realized. For example, the signal SS controls the switches SW1-SW5 to be in an open state, thus realizing a filter with a function similar to that filter circuit of FIG. 5.

Figure 7:
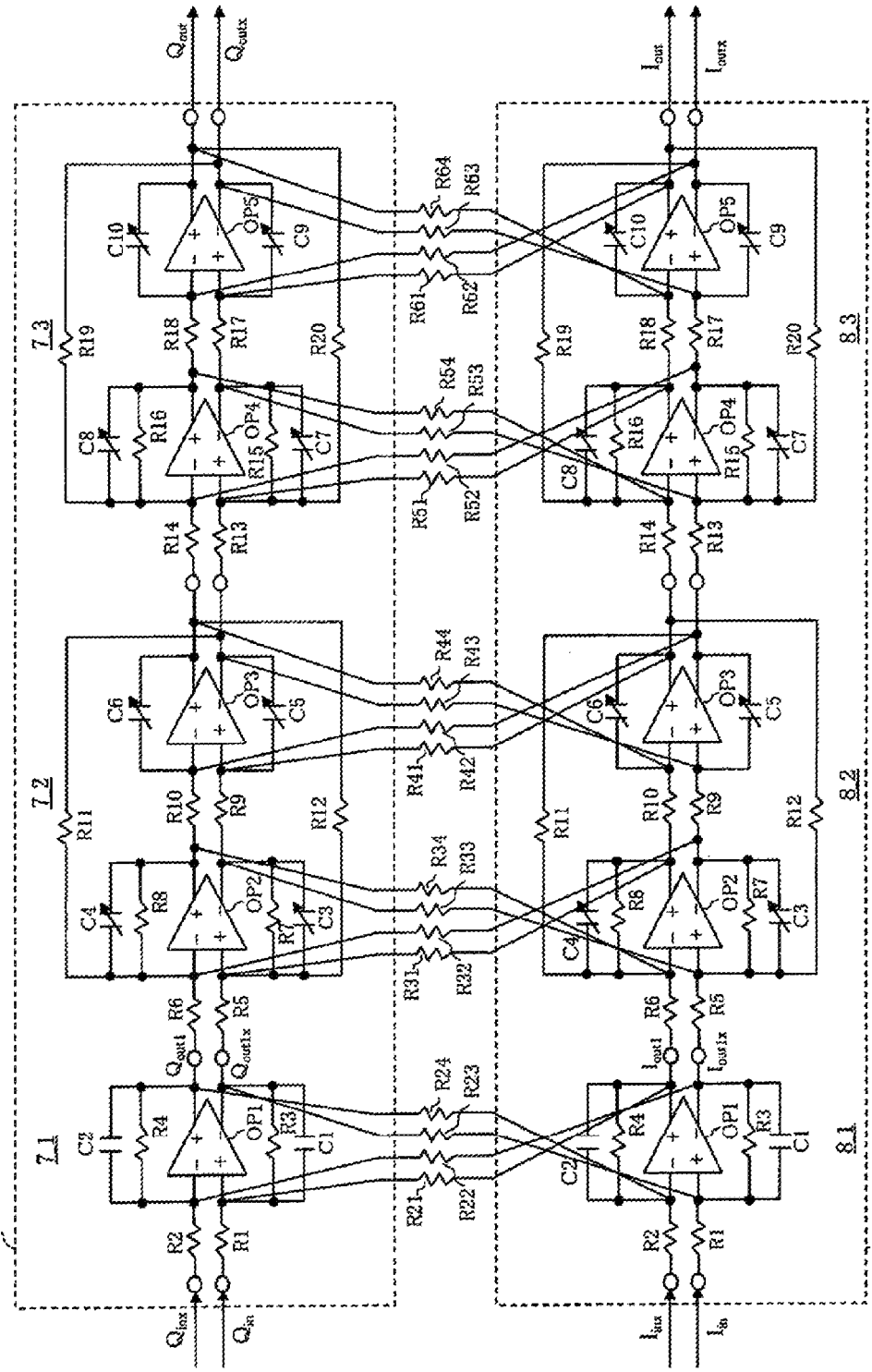
FIG. 7 is a circuit diagram of a conventional complex filter which serves as the filter circuit shown in FIG. 1 and in which the fifth-order Butterworth lowpass filters are connected to each other by resistors.
Figure 8A:
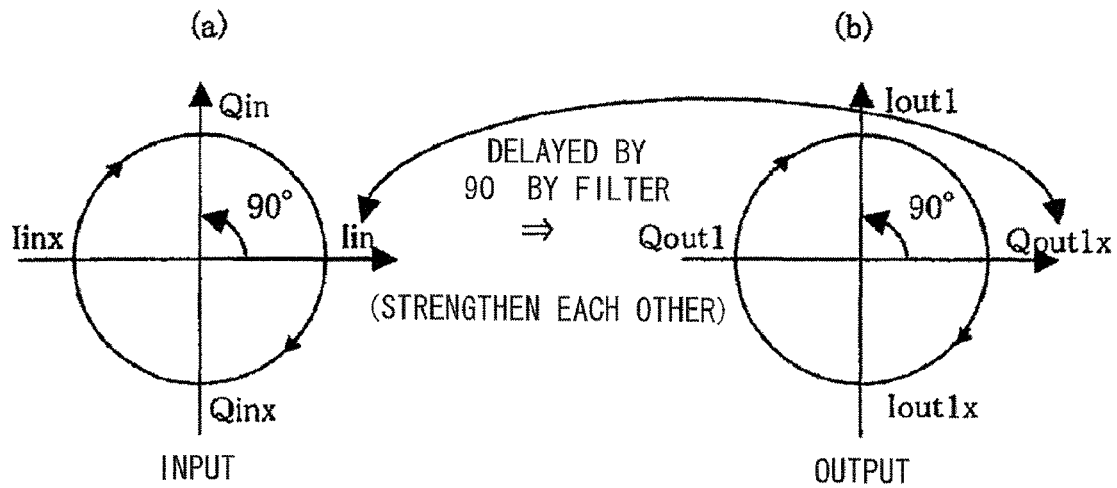
FIGS. 8A & 8B illustrate a phase relationship between an I component and a Q component in the complex filter of FIG. 7.
Figure 8B:
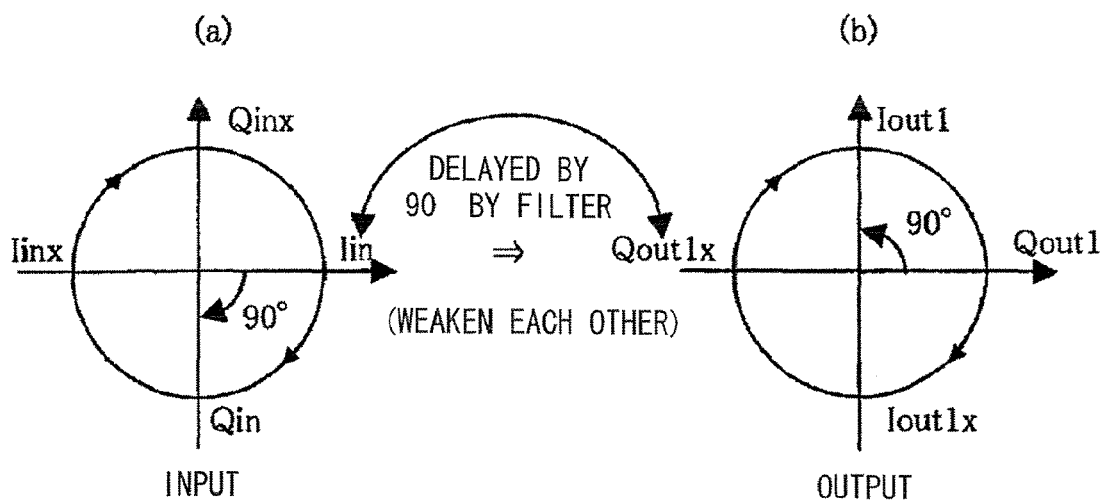
Figure 10A:
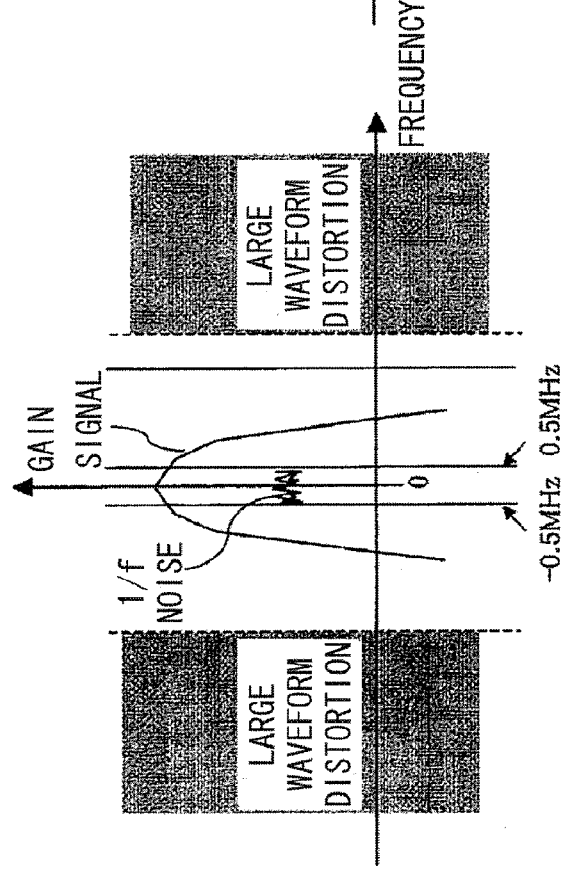
FIGS. 10A & 10B illustrate relationships between a Bluetooth signal and the zero-IF and low-IF schemes.
Figure 10B:
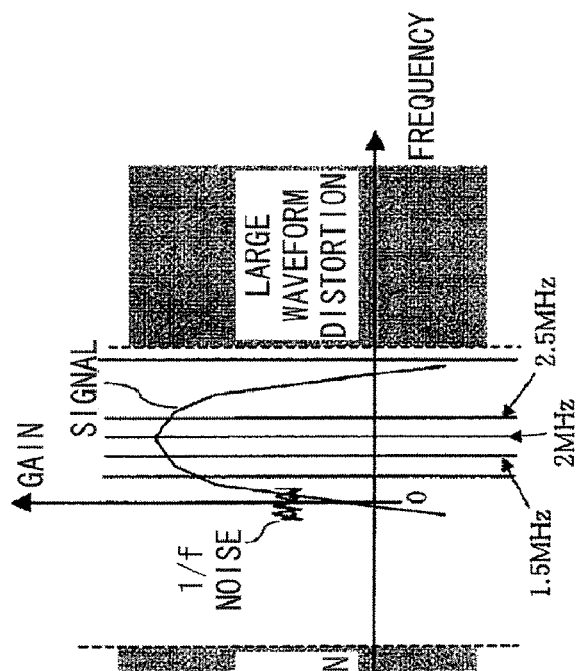

If the switching signal SS is on and hence indicates the low-IF scheme, all of the switches SW1-SW5 are controlled to an on state, whereby the filter circuit of FIG. 7 which is a complex filter is realized. For example, the signal SS controls the switches SW1-SW5 to be in a closed state, thus realizing a filter with a function similar to that filter circuit of FIG. 7.

Figure 12B:
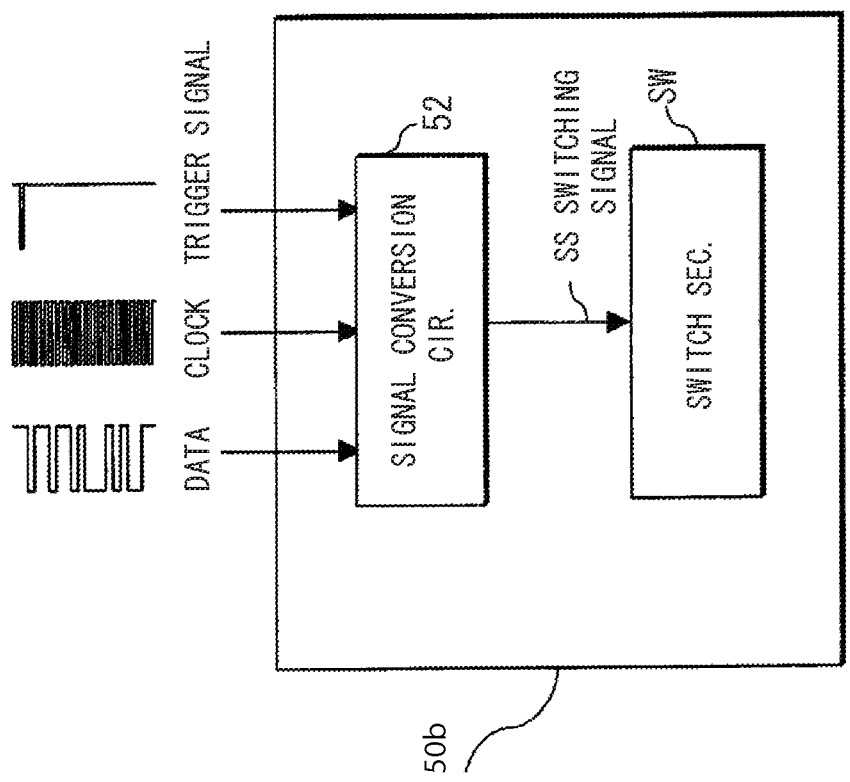
FIGS. 12A & 12B show exemplary block diagrams of embodiments of a switch section used in the filter circuit of FIG. 11.
Figure 12A:
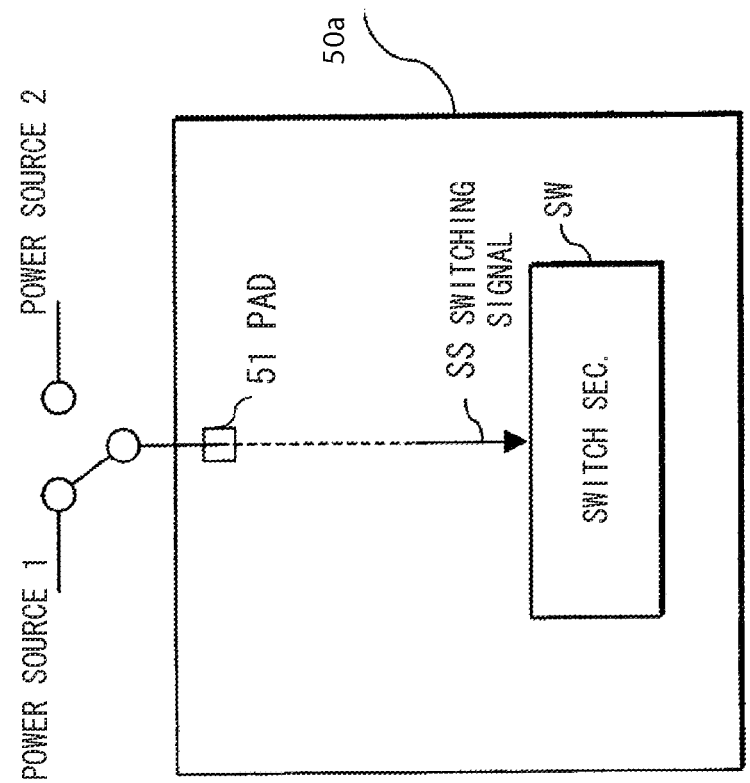

FIGS. 12A & 12B show example embodiments of the switch section SW shown in FIG. 11. In the embodiment of FIG. 12A, an IC circuit 50a, which incorporates the switch section SW, can switch between the zero-IF scheme and the low-IF scheme according to a switching signal SS depending on whether a particular terminal (PAD) 51 is connected to power source 1 or power source 2.

In the embodiment of FIG. 12B, an IC circuit 50b uses data, a clock and a trigger signal. A signal conversion circuit 52 receives the data, clock, and trigger signal, judges whether the data indicates the zero-IF scheme or the low-IF scheme generates a switching signal SS according to a judgment result, and sends the switching signal SS to the switch section SW.

The invention is not limited to the above embodiments, and it is apparent that those skilled in the art can make various modifications on the basis of the appended claims. Furthermore, the functions of the various elements shown in the figures may be provided through the use of dedicated hardware as well as hardware capable of executing appropriate software. For example, processor(s), controller(s), digital signal processor hardware, ROM, RAM, and non-volatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A filter circuit comprising:
    first and second real filters of a zero-IF scheme which are provided for receiving an I component and a Q component separated from a reception signal, respectively; and
    a switch section for producing a complex filter by switchably connecting the first and second real filters through interconnection elements when receiving a switching signal for switching from the zero-IF scheme to a low-IF scheme,
    wherein the complex filter outputs a mixing of I and Q components from the two real filters, and
    wherein each of the first and second real filters includes at least one operational amplifier, and an input of the operational amplifier in the first filter is coupled to an output of the operational amplifier in the second filter based on the switching signal in the low-IF scheme, and wherein an output of the operational amplifier in the first filter is coupled to an input of the operational amplifier in the second filter based on the switching signal in the low-IF scheme.

2. The filter circuit according to claim 1, wherein the interconnection elements are resistors.

3. The filter circuit according to claim 1, wherein each of the first and second real filters is a Butterworth lowpass filter.

4. The filter circuit according to claim 1, further comprising a signal conversion circuit for generating the switching signal when receiving prescribed data.

5. The filter circuit according to claim 1, wherein the switching signal is based on a connection to one of at least two particular power sources.

6. A filter comprising
    a first real filter of a zero-IF scheme;
    a second real filter of a zero-IF scheme; and
    a switch section for switchably interconnecting said first and second real filters through interconnection elements, wherein
    interconnecting said first and second real filters through said interconnection elements provides a complex filter, and wherein the complex filter outputs a mixing of outputs from said first and second real filters, and
    wherein each of the first and second real filters includes at least one operational amplifier, and an input of the operational amplifier in the first filter is coupled to an output of the operational amplifier in the second filter based on the switching signal in a low-IF scheme, and wherein an output of the operational amplifier in the first filter is coupled to an input of the operational amplifier in the second filter based on the switching signal in the low-IF scheme.

7. The filter of claim 6, wherein
said first and second real filters receive an I component and a Q component separated from a reception signal, respectively; and
said complex filter is of a low-IF scheme.

8. The filter of claim 6, wherein a signal provides an indication of whether said first and second real filters should provide an output according to the zero-IF scheme or according to said complex filter as a low-IF scheme.

9. The filter of claim 8, wherein the signal is determined from receiving predetermined data.

10. The filter according to claim 6, wherein the interconnection elements are resistors.

11. The filter according to claim 6, wherein the signal is determined from a connection to a particular power source.

12. A method of filtering a signal comprising:
receiving an I component and a Q component separated from a reception signal at first and second real filters of a zero-IF scheme, respectively; and
switchably interconnecting the first and second real filters of the zero-IF scheme through interconnection elements to provide a complex filter of a low-IF scheme,
wherein the complex filter outputs a mixing of I and Q components from the two real filters, and
wherein each of the first and second real filters includes at least one operational amplifier, and an input of the operational amplifier in the first filter is coupled to an output of the operational amplifier in the second filter based on the switching signal in the low-IF scheme, and wherein an output of the operational amplifier in the first filter is coupled to an input of the operational amplifier in the second filter based on the switching signal in the low-IF scheme.

13. The method of claim 12, further comprising:
determining, from an input condition, whether the first and second real filters of the zero-IF scheme should be interconnected through interconnection elements to provide the complex filter of the low-IF scheme.

14. The method of claim 12, further comprising:
determining, from an input signal, whether the first and second real filters of the zero-IF scheme should be interconnected through interconnection elements to provide the complex filter of the low-IF scheme.

15. The method of claim 12, wherein the interconnection elements are resistors, and each of the first and second real filters is a Butterworth lowpass filter.

16. A filter circuit comprising:
first and second real filters of a zero-IF scheme which are provided for receiving an I component and a Q component separated from a reception signal, respectively; and
a switch section for producing a complex filter by switchably connecting the first and second real filters through interconnection elements when receiving a switching signal for switching from the zero-IF scheme to a low-IF scheme,
wherein the switching signal is based on a connection to one of at least two particular power sources, and
wherein each of the first and second real filters includes at least one operational amplifier, and an input of the operational amplifier in the first filter is coupled to an output of the operational amplifier in the second filter based on the switching signal in the low-IF scheme, and wherein an output of the operational amplifier in the first filter is coupled to an input of the operational amplifier in the second filter based on the switching signal in the low-IF scheme.

17. The filter circuit according to claim 16, wherein the complex filter outputs a mixing of I and Q components from the two real filters.

* * * * *